United States Patent [19]

Masui

[11] Patent Number: 5,754,561
[45] Date of Patent: May 19, 1998

[54] LARGE SCALE INTEGRATED CIRCUIT EQUIPPED WITH A NORMAL INTERNAL LOGIC TESTING CIRCUIT AND UNCONNECTED/SUBSTANDARD SOLDER TESTING CIRCUIT

[75] Inventor: Kazuhiro Masui, Yokohama, Japan

[73] Assignee: Fujitsu Limited, Kawasaki, Japan

[21] Appl. No.: 863,520

[22] Filed: May 27, 1997

Related U.S. Application Data

[63] Continuation of Ser. No. 297,533, Aug. 31, 1994, abandoned.

[30] Foreign Application Priority Data

Oct. 18, 1993 [JP] Japan ............... 5-259807
Aug. 9, 1994 [JP] Japan ............... 6-187504

[51] Int. Cl.$^6$ ............... G01R 31/28
[52] U.S. Cl. ............... 371/22.5
[58] Field of Search ............... 371/22.1, 22.5, 371/22.6, 25.1; 324/73.1, 500, 763, 158.1; 395/183.01, 183.03, 183.06

[56] References Cited

U.S. PATENT DOCUMENTS

| | | | |
|---|---|---|---|
| 4,357,703 | 11/1982 | Van Brunt ............... | 371/15 |
| 4,395,767 | 7/1983 | Van Brunt et al. ............... | 371/25 |
| 4,450,560 | 5/1984 | Conner ............... | 371/25 |
| 4,680,761 | 7/1987 | Burkness ............... | 371/25 |
| 5,138,619 | 8/1992 | Fasang et al. ............... | 371/21.1 |
| 5,379,300 | 1/1995 | Yamahata ............... | 371/15.1 |
| 5,446,395 | 8/1995 | Goto ............... | 324/763 |

Primary Examiner—Robert W. Beausoliel, Jr.
Assistant Examiner—Stephen C. Elmore
Attorney, Agent, or Firm—Staas & Halsey

[57] ABSTRACT

An LSI equipped with an internal logic circuit which outputs a normal external output signal to the outside of the LSI during normal operation, and which outputs a test signal which is used for internal logic testing. An LSI is also equipped with an internal logic and unconnected/substandard-solder testing circuit which performs both internal logic testing and unconnected/substandard-solder testing. This internal logic and unconnected/substandard-solder testing circuit is equipped with an internal logic testing logic circuit into which the abovementioned test signals are input, an unconnected/substandard-solder testing logic circuit to which prescribed input and output terminals of the abovementioned LSI are connected, and one output logic circuit which controls the output of the above-mentioned internal logic testing logic circuit and the output of the abovementioned unconnected/substandard-solder testing logic circuit. Then, the abovementioned normal external output signal from the abovementioned internal logic circuit is supplied directly to the external output terminal of the LSI. Since this normal external output signal is output directly from the internal logic circuit to the external output terminal, without passing through gate circuits and the like, signal delays do not occur. Furthermore, it is possible to reduce the number of gate circuits because the circuits, which perform the internal logic testing and the unconnected/substandard-solder testing, have been made into a common circuit.

5 Claims, 7 Drawing Sheets

LARGE SCALE INTEGRATED CIRCUIT EQUIPPED WITH A NORMAL INTERNAL LOGIC TESTING CIRCUIT AND UNCONNECTED/SUBSTANDARD SOLDER TESTING CIRCUIT

This application is a continuation of application Ser. No. 08/297,533, filed Aug. 31, 1994, now abandoned.

BACKGROUND OF THE INVENTION

1. Field of the Invention

The present invention relates to LSI (Large Scale Integrated Circuits).

With the high integration of LSI's in recent years there has been a demand for the realization of simple and reliable tests for whether or not LSI's are operating correctly. For this reason, internal logic testing circuits, which perform operational testing of the internal logic circuits, have been provided in some LSI's. Moreover, when LSI's are mounted on a substrate, their input and output terminals are soldered to the wiring on the substrate. Unconnected/substandard-solder testing circuits are provided in some LSI's to test whether or not these soldered portions are correctly bonded.

The present invention relates to LSI's which are equipped, inside the LSI, with internal logic testing circuits for testing the internal logic circuits, which internal logic circuits perform primary logic functions, and with unconnected/substandard-solder testing circuits which detect substandard bonding of the soldered portions of the input and output terminals of the LSI.

2. Description of the Related Art

Figure 1:
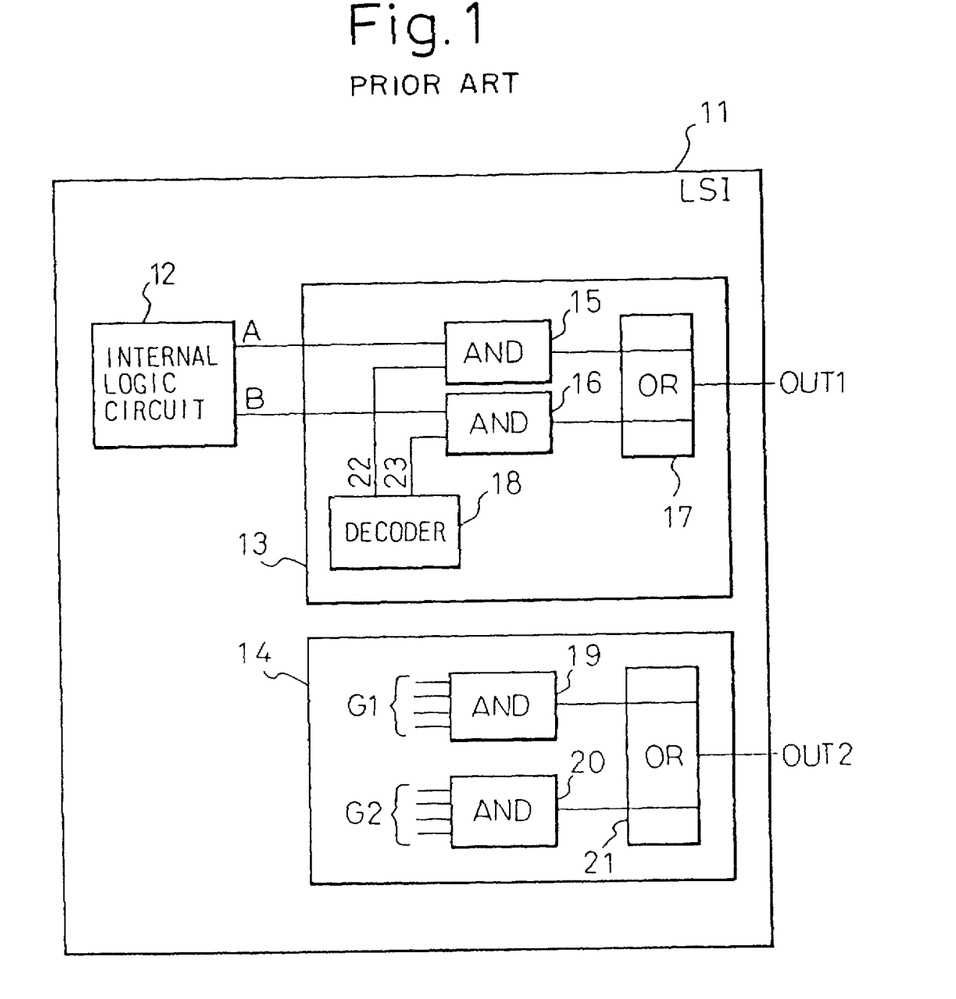
FIG. 1 is a block diagram showing the outline of an LSI equipped with a normal internal logic testing circuit and unconnected/substandard-solder testing circuit.

FIG. 1 is a block diagram showing the outline of an LSI equipped with a normal internal logic testing circuit and unconnected/substandard-solder testing circuit. Inside the LSI 11 there are provided an internal logic circuit 12 which performs the primary logic functions, an internal logic testing circuit 13 for testing the logic functions of this internal logic circuit 12, and an unconnected/substandard-solder testing circuit 14 for detecting places of substandard bonding of the soldered portions of the input and output terminals (not shown) of the LSI 11. It should be noted that, in this diagram, the indication of the wiring between the input side of the internal logic circuit 12 and the input terminals of the LSI has been omitted in order to simplify the diagram. In the same way the indication of the wiring between the input side of the unconnected/substandard-solder testing circuit 14 and the input and output terminals of the LSI has also been omitted.

A test signal A and a normal external output signal B are output from the internal logic circuit 12, and both of the signals A and B are supplied to the internal logic testing circuit 13. Of these, the test signal A is a signal which is normally not output outside the LSI 11, and is a logic signal which is used only when internal logic testing is being performed. Also, the normal external output signal B is a signal which is output from the external output terminal OUT1 to external circuits during normal operation of the LSI 11, and the normal external output signal B is a basic output signal of the LSI 11. It should be noted that the test signal A and the normal external output signal B are normally output from the internal logic circuit 12 in plurality, and the number of external output terminals OUT1 provided is also equal to the number of normal external output signals B. However, in this diagram only one of each signal and terminal are shown in order to simplify the explanation.

In the internal logic testing circuit 13, the test signal A and the normal external output signal B are respectively input into one of the input terminals of separate AND circuits 15 and 16. Also, select signals 22 and 23, generated by a decoder 18, are input into the other input terminals of the AND circuits 15 and 16. The outputs of the AND circuits 15 and 16 then pass through an OR circuit 17 and are output to the output terminal OUT1.

In the unconnected/substandard-solder testing circuit 14, the wires from the input terminals and output terminals in which substandard solder contacts are to be looked for, from among those input terminals and output terminals of the LSI 11 which are under test, are divided into desired groups G1 and G2, and are input into AND circuits 19 and 20 in the respective groups G1 and G2. The outputs of the AND circuits 19 and 20 then pass through an OR circuit 21 and are output to an output terminal OUT2.

The operation of the LSI 11 during normal operation, during internal logic testing and during unconnected/substandard-solder testing will now be described.

During normal operation of the LSI 11, the select signal 23 is output from a decoder 18 to the AND circuit 16, which is being supplied with the normal external output signal B. By means of this, the normal external output signal B of the internal logic circuit 12 passes through the AND circuit 16 and the OR circuit 17, and is output to the output terminal OUT1.

During internal logic testing of the LSI 11, a test pattern is input into each of the input terminals of the LSI 11 from an LSI tester, not shown. The select signal 22 is then output via the decoder 18 to the AND circuit 15 which is being supplied with the test signal A. By means of this, the test signal A passes through the AND circuit 15 and the OR circuit 17, and is output to the output terminal OUT1. In the LSI tester, this test signal A is observed. If a signal which is the same as the expected value, corresponding to the test pattern, is observed as the test signal A, then the internal logic circuit 12 is judged to be normal. If a signal which is different from the expected value is observed as the test signal A, then there are judged to be abnormalities in the internal logic circuit 12.

During unconnected/substandard-solder testing, test patterns are input from the LSI tester into those input terminals and output terminals of the LSI 11 in which substandard contact is being tested. These test patterns are divided into groups G1 and G2 and are input into the AND circuits 19 and 20. If there is a place of substandard bonding in the soldered portions, then even if a logical "1" is input as the test pattern from the LSI tester to this terminal, this signal will not be transmitted and the input at the AND circuit 19 of 20 will be a logical "0". Therefore, by inputting various test pattern signals to each of the input and output terminals under test, and observing the output signal at the output terminal OUT2, the presence or otherwise of substandard bonding in the soldered portions, can be judged, and these substandard locations can be specified.

It should be noted that in the example explained above one each of the test signal A and the normal external output signal B are taken from the internal logic circuit 12 but, as explained earlier, the test signal A and the normal external output signal B are normally output from the internal logic circuit 12 in plurality. An example of the internal logic testing circuit 13, when such a plurality of test signals and normal external output, signals are output will be described using FIG. 2.

Figure 2:
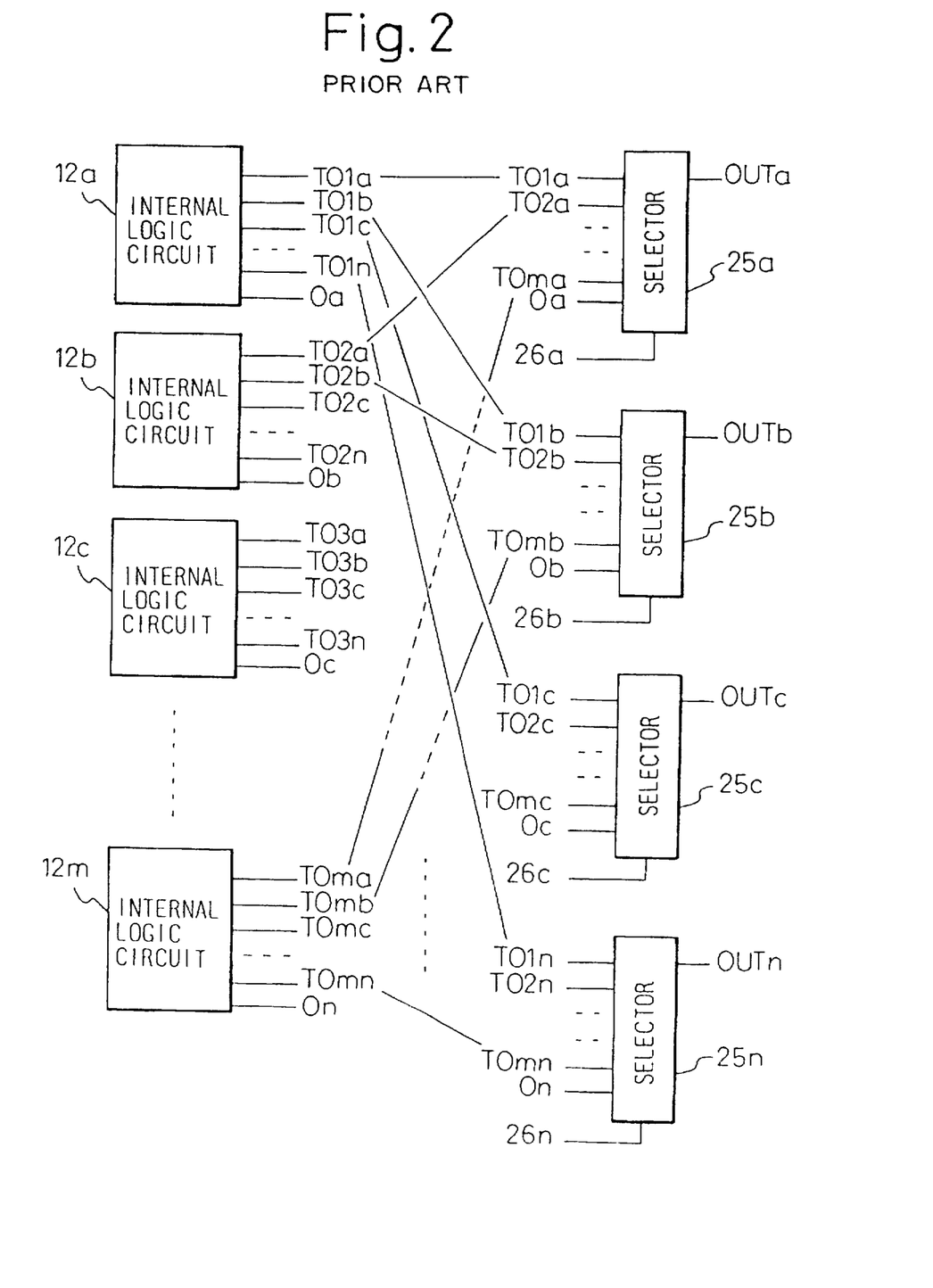
FIG. 2 is a block diagram shown an alternative example of the internal logic testing circuit of FIG. 1.

In FIG. 2, a signal internal logic circuit comprises a plurality of internal logic circuits 12a ... 12m. Each of the internal logic circuits 12a ... 12m outputs a plurality of logic signals. For example, the first internal logic circuit 12a outputs n test signals TO1a ... TO1n and one normal external output signal Oa. It should be noted that the input wiring for each of the internal logic circuits 12a ... 12m has been omitted in the diagram.

The test signals and normal external output signals output from each of the internal logic circuits 12a ... 12m are respectively input into n selectors 25a ... 25n. For example, the test signals TO1a ... TO1n of the first internal logic circuit 12a are supplied to the first input terminals of the selectors 25a ... 25n, and the test signals TO2a ... TO2b of the second internal logic circuit 12b are supplied to the second input terminals of the selectors 25a ... 25n. Hereafter, the test signals of each of the internal logic circuits are input in the same way to the input terminals of the selectors 25a ... 25n. Then, one each of the normal external output signals Oa ... On, output from the internal logic circuits 12a ... 12m, are input into the final input terminals of the selectors 25a ... 25n. It should be noted that the connections between the internal logic circuits 12a ... 12m and the normal external output signals Oa ... On are omitted in the diagram. Also, the selectors 25a ... 25n are abbreviated in the diagram, but they comprises AND circuits and OR circuits.

When performing internal logic testing by means of the circuit of FIG. 2, if signals for selecting which of the m internal logic circuits 12a ... 12m to test are input as test select signals 26a ... 26n to the selectors 25a ... 25n, then those input terminals which are connected to the selected internal logic circuits are selected, in the selectors 25a ... 25n. As a result, the test signals output by the selected internal logic circuits are output to the output terminals OUTa ... OUTn. For example, if signals for selecting the first input signal are supplied as the test select signals 26a ... 26n to each of the selectors 25a ... 25n, then the test signals TO1a ... TO1n, generated by the first internal logic circuit 12a, are generated at the output terminals OUTa ... OUTn of the selectors 25a ... 25n.

Also, when internal logic testing is not being performed, operation is performed in normal operating mode. In this case, signals for selecting the final input terminals, to which the normal external output signals Oa ... On are supplied, are supplied as the test select signals 26a ... 26n to the selectors 25a ... 25n. Thus, the normal external output signals Oa ... On of the internal logic circuits are generated at the output terminals OUTa ... OUTn, and are supplied to the external circuits.

In the internal logic testing circuit of a conventional LSI, described above, the problem arises that the number of the test selectors increases as the number of test signals of the internal logic circuits increases, bringing about an increase in the number of AND circuit and OR circuit gates which the selectors comprise. Moreover, delays occur in the output signals of the LSI during normal operation since the normal external output signals B are output via the selectors 25 which comprise AND circuits and OR circuits.

SUMMARY OF THE INVENTION

Therefore, the present invention provides an LSI, which can prevent increases in the number of gates provided in the LSI for internal logic testing and for unconnected/substandard-solder testing, even when the number of output signals of the internal logic circuits increases. Further, the present invention provides an LSI, which can reduce delays in the normal external output signals output during normal operation of the LSI.

In the present invention, in order to achieve the abovementioned objects, an LSI equipped with an internal logic circuit which outputs a normal external output signal, output to the outside of the LSI during normal operation, and a test signal which is used for internal logic testing, is provided with an internal logic and unconnected/substandard-solder testing circuit which performs both internal logic testing and unconnected/substandard-solder testing. This internal logic and unconnected/substandard-solder testing circuit is equipped with an internal logic testing logic circuit into which the abovementioned test signals are input, an unconnected/substandard-solder testing logic circuit to which prescribed input and output terminals of the abovementioned LSI are connected, and one output logic circuit which controls the output of the abovementioned internal logic testing logic circuit and the output of the abovementioned unconnected/substandard-solder testing logic circuit. Then, the abovementioned normal external output signal from the abovementioned internal logic circuit is supplied directly to the external output terminal of the LSI.

Since this normal external output signal is output directly from the internal logic circuit to the external output terminal, without passing through gate circuits and the like, signal delays do not occur. Furthermore, it is possible to reduce the number of gate circuits since the circuits which perform the internal logic testing and the unconnected/substandard-solder testing have been made into a common circuit.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Figure 3:
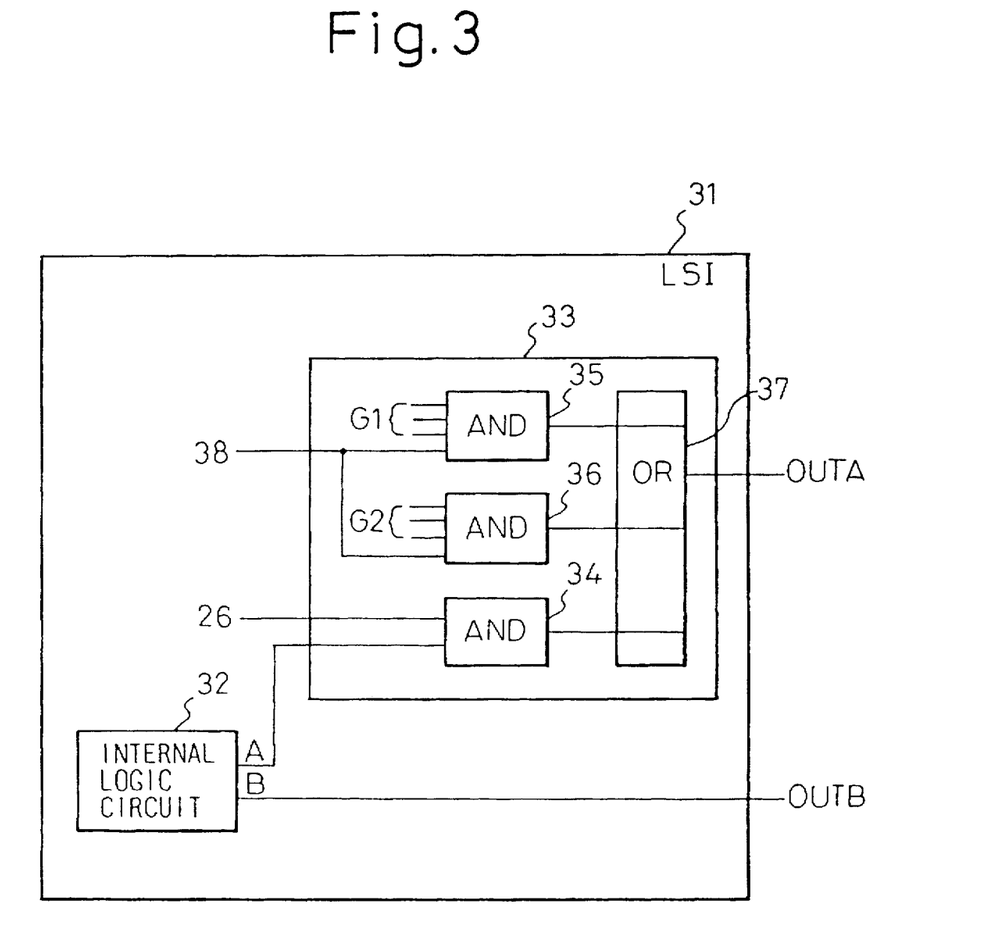
FIG. 3 is a block diagram showing a first embodiment of an LSI equipped with the internal logic and unconnected/substandard-solder testing circuit of the present invention.

FIG. 3 is a block diagram showing a first embodiment of the present invention. This example has one each of the test signals and normal external output signals of the internal logic circuit, in order to simplify the comparison with the normal LSI shown in FIG. 1, described above.

Inside the LSI 31 there are provided an internal logic circuit 32, which performs the primary functions of the LSI, and an internal logic and unconnected/substandard-solder testing circuit 33 for testing the functions of this internal logic circuit 32 and for detecting substandard bonding of the soldered portions of the input and output terminals (not shown) of the LSI 31. It should be noted that, in this diagram, the indication of the wiring between the input side of the internal logic circuit 32 and the input terminals of the LSI has been omitted.

A test signal A and a normal signal B are input signal B are output from the internal logic circuit 32. Of these, the test signal A is a signal which is normally not output outside the LSI 31. The test signal A is a logic signal which is used only when internal logic testing is being performed. Also, the normal external output signal B is a signal which is output to the outside as a basic output signal of the LSI 31. The normal external output signal is a signal which is output from the external output terminal OUTB to external circuits of the LSI 31 during normal operation of the LSI 31 that is, when testing operations are not being performed. It should be noted that the test signal A and the normal external output signal B may be signals having the same content.

The normal external output signals B of the internal logic circuit 32 is output directly to the external output terminal OUTB. On the other hand, the test signal A of the internal logic circuit 32 is input into one input terminal of an internal logic testing AND circuit 34, in the internal logic and unconnected/substandard-solder testing circuit 33. A test select signal 26 for selecting the internal logic signal is input into the other input terminal of this AND circuit 34. The output terminal of the AND circuit 34 is connected to one input terminal of an output OR circuit 37.

Two unconnected/substandard-solder testing AND circuits 35 and 36 are provided in the internal logic and unconnected/substandard-solder testing circuit 33. The wires from the input terminals and output terminals in which substandard contact in the soldered portions is being tested for, from among the input terminals and output terminals (not shown) of the LSI 31, are divided into prescribed groups G1 and G2, and are input into the input terminals of these AND circuits 35 and 36. It should be noted that in the present embodiment the number of group divisions and the number of AND circuits for use in the unconnected/substandard-solder testing are two, but these numbers can be set to be any number above or including one. Also, the wiring from the input and output terminals under test to the AND circuits 35 and 36 has been omitted in order to simplify the diagram. In addition, an LSI test mode signal 38 is input into input terminals of the AND circuits 35 and 36. The output terminals of these AND circuits 35 and 36 are connected to input terminals of the output OR circuit 37, to which the output of the internal logic testing AND circuit 34 is connected.

The operation of the LSI 31 of the present embodiment during normal operation, during internal logic testing and during unconnected/substandard-solder testing will now be described.

During normal operation of the LSI 31, an input signal input from an input terminal (not shown) of the LSI 31 is output as the test signal A to the internal logic and unconnected/substandard-solder testing circuit 33, and as the normal external output signal B directly to the output terminal OUT1, by means of the operation of the internal logic circuit 32.

During this normal operation, there is no output from the output terminal OUTA of the internal logic and unconnected/substandard-solder testing circuit 33. The reason is that the test select signal 26 and the LSI test mode signal 38, sent to the AND circuits 34, 35 and 36 of the internal logic and unconnected/substandard-solder testing circuit 33, are both set to "0". Also, no delay occurs during this normal external operation because the normal external output signal B is transferred directly to the output terminal OUTB without passing through either AND circuits or OR circuits.

Figure 4:
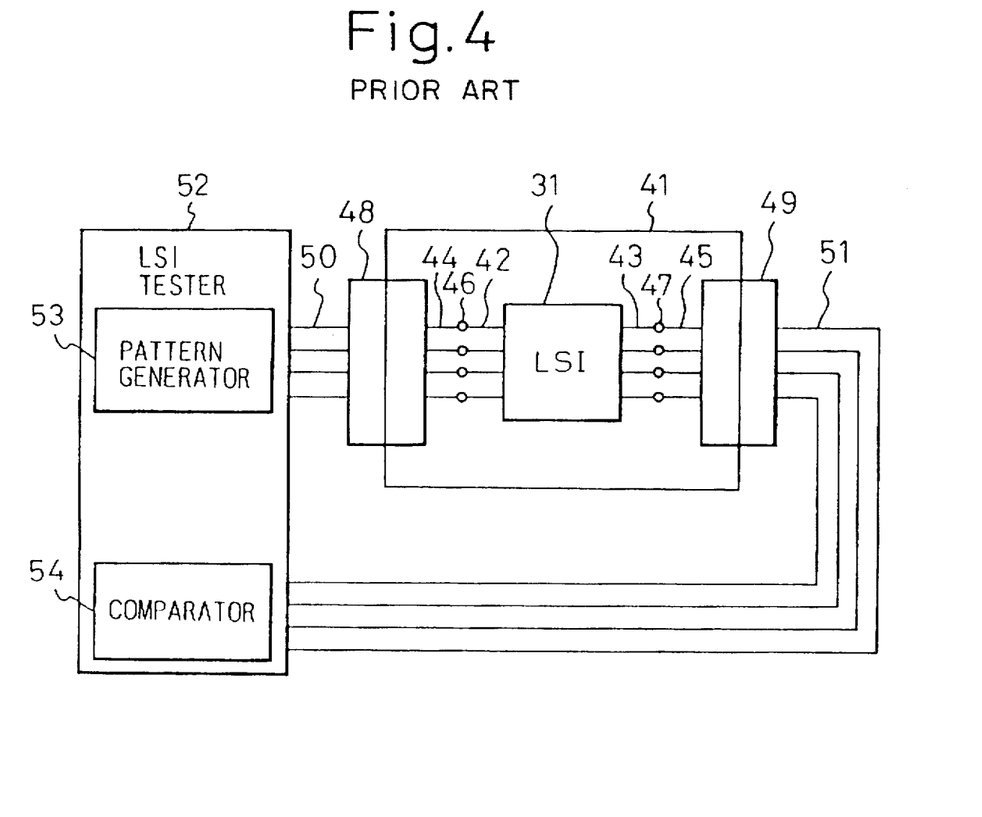
FIG. 4 is a block diagram showing the testing circuit which performs the LSI internal logic testing and unconnected/substandard-solder testing.

Next, the testing circuit shown in FIG. 4 is used when performing internal logic testing and unconnected/substandard-solder testing with respect to the LSI. In FIG. 4, the LSI 31 is installed on a printed board 41, which is a test board, and input terminals 42 and output terminals 43 thereof are connected to printed wirings 44 and 45 of the printed board 41 at soldered portions 46 and 47, using solder. Then, the printed wirings 44 and 45 are connected to an LSI tester 52 via connectors 48 and 49 and cables 50 and 51. The LSI tester 52 has a pattern generator 53 and a comparator 54. This LSI tester 52 is known, so its description will be omitted here.

During internal logic testing of the LSI 31, a test pattern, prepared by the user or the designer, for testing the LSI is loaded into the LSI tester. This test pattern includes signals for input into the LSI and output values expected when these input signals are input. The pattern generator 53 in the LSI tester 52 forms signals from the test pattern, and inputs these input signals into the input terminals 42 of the LSI 31. At this time, during internal logic testing of the LSI, the LSI test mode signal in FIG. 3 is set to a logical "0", and the unconnected/substandard-solder testing AND circuits 35 and 36 are masked. Also, the test select signal 26, input into the internal logic testing AND circuit 34, is set to a logical "1", so the test signal A which is output by the operation of the internal logic circuit 32 passes through the AND circuit 34 and the OR circuit 37, and is output from the output terminal OUTA to the LSI tester 52 of FIG. 4.

The comparator 54 in the LSI tester 52 compares the output from the LSI 31 with the expected output values from the test pattern. Then, if the output from the LSI and the expected output values are the same, then the LSI is normal, and if they are not the same then there are judged to be abnormalities of some kind, in other words faults, in the LSI.

Also during unconnected/substandard-solder testing of the LSI 31, a test pattern, which includes signals input into the LSI and output values expected when these input signals are input, prepared by the user or the designer, is loaded into the LSI tester shown in FIG. 4. The pattern generator 53 in the LSI tester 52 forms signals from the test pattern, and inputs these input signals into those terminals to which unconnected/substandard-solder testing is to be performed, from among the input terminals 42 and output terminals 43 of the LSI 31. It should be noted that, in the unconnected/substandard-solder testing, the terminals to which these input signals are applied can include output terminals as well as input terminals.

By inputting the test pattern, during LSI unconnected/substandard-solder testing, the test select signal 26 in FIG. 3 is set to a logical "0", and the internal logic testing AND circuit 34 is masked. Furthermore, the LSI test mode signal 38 for unconnected/substandard-solder testing, input into the unconnected/substandard-solder testing AND circuits 35 and 36, is set to a logical "1".

As outlined above, the wires from those input terminals 42 and output terminals 43 of the LSI 31 which are under test are divided into prescribed groups G1 and G2 and input into the unconnected/substandard-solder testing AND circuits 35 and 36. The unconnected/substandard-solder testing is performed on each of the groups G1 and G2. When a group, for example group G1, is to be tested, any one at least of the input signals of the AND circuit of the other group, in other words the AND circuit 36 of the group G2, is set to a logical "0", masking this AND circuit 36.

Now, if all of the soldered portions 46 and 47 are correctly connected, and if a logical "1" signal is input into all of the input and output terminals in the group G1, then the output of the AND circuit 35 will be a logical "1", and the expected value obtained from the output terminal OUTA will be "1". Then, if one of the signals of the group G1 is set to a logical "0", and the other signals are set to a logical "1", then the output of the AND circuit 35 will be a logical "0", and the expected value obtained from the output terminal OUTA will be "0".

According to the above principle, the pattern generator 53 in the LSI tester 52 inputs input signals of various patterns into the input terminals 42 and output terminals 43 of the LSI 31. The comparator 54 compares the output from the output terminal OUTA of the LSI 31 with the expected output values from the test pattern. Therefore, by inputting various test pattern signals to each of the input and output terminals under test, and observing the output signal at the output terminal OUTA, the presence or otherwise of substandard bonding in the soldered portions, and these substandard locations can be specified.

In the internal logic and unconnected/substandard-solder testing circuit 31 described above, the number of gate circuits in the LSI can be reduced because the output OR circuit 37 is used both for the internal logic testing and for the unconnected/substandard-solder testing. In addition, the design and production of the LSI can be simplified because the internal logic testing and unconnected/substandard-solder testing AND circuits and OR circuits can be dealt with in common.

In the first embodiment described above, only one test signal A and normal external output signal B each are output from the internal logic circuit 32. In a normal LSI, however, a plurality of both the test signals A and the normal external output signals B are output. An example, in which the present invention is applied to an LSI which outputs a plurality of test signals A and normal external output signals B, will be described using FIG. 5. It should be noted that in FIG. 5, items, which have the same functions as those in FIG. 3 of the embodiment described above, have been given the same reference numbers. Also, an explanation which duplicates that given for FIG. 3 is omitted in the following description.

Figure 5:
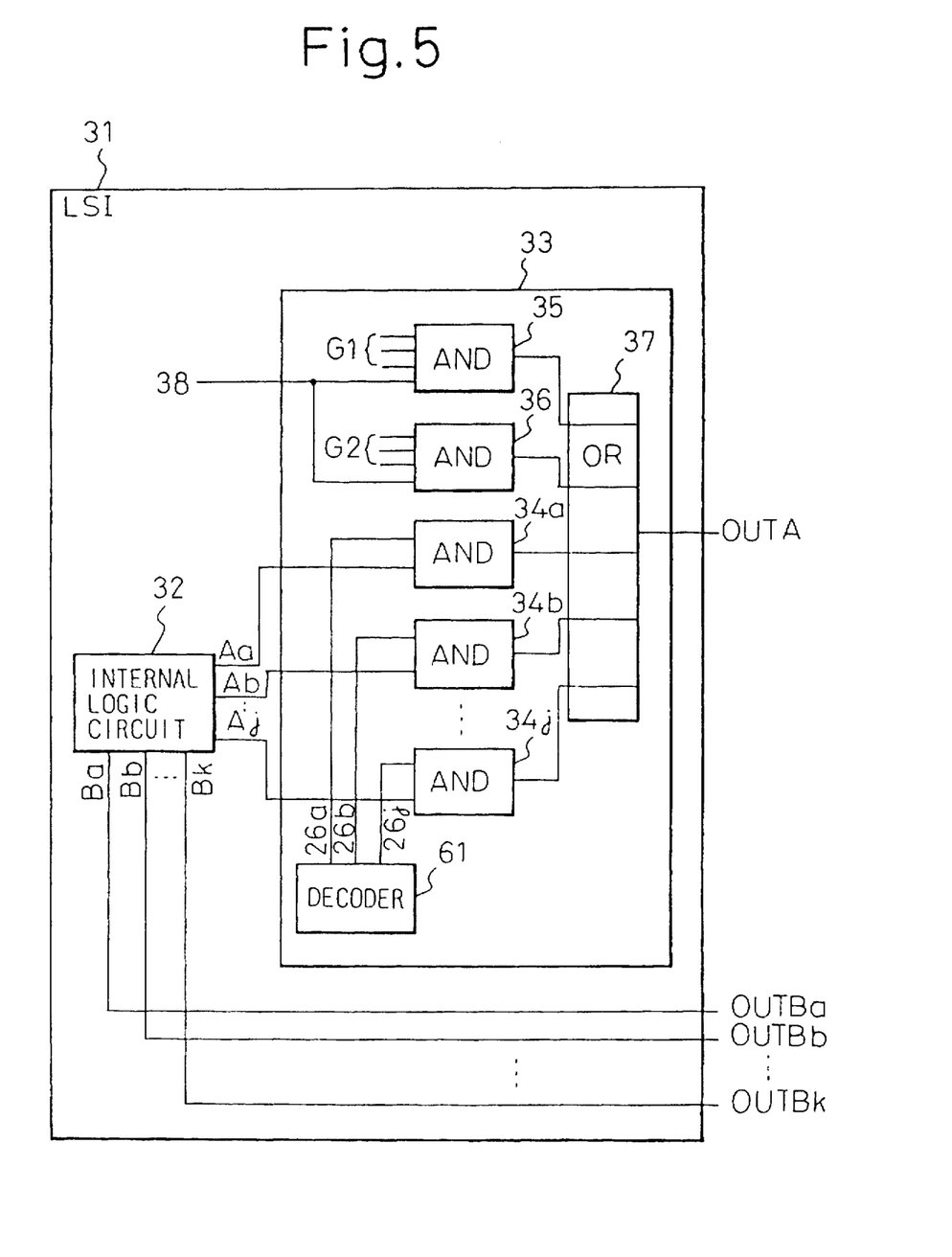
FIG. 5 is a block diagram of a second embodiment of an LSI equipped with the internal logic and unconnected/substandard-solder testing circuit of the present invention.

In FIG. 5, the internal logic circuit 32 of the LSI 31 outputs a plurality of test signals Aa . . . Aj and a plurality of normal external output signals Ba . . . Bk. The normal external output signals Ba . . . Bk are respectively output directly to external output terminals OUTBa . . . OUTBk. The test signals Aa . . . Aj of the internal logic circuit 32 are input into one of the input terminals of internal logic testing AND circuits 34a . . . 34j of the internal logic and unconnected/substandard-solder testing circuit 33. Test select signals 26a . . . 26j for selecting the internal logic signals are input from a decoder 61 into the other terminals of the AND circuits 34a . . . 34j.

Further, unconnected/substandard-solder testing AND circuits 35 and 36 are provided in the internal logic and unconnected/substandard-solder testing circuit 33. The outputs of each AND circuit 34a . . . 34j, 35 and 36 are input into one output OR circuit 37, and the output of the OR circuit 37 is connected to one output terminal OUTA.

During normal operation of the LSI 31 described above, the LSI test mode signal 38 is set to a logical "0", all of the test select signals 26a . . . 26j are set to a logical "0", and all of the AND circuits in the internal logic and unconnected/ substandard-solder testing circuit 33 are masked. Then, the normal external output signals Ba . . . Bk of the internal logic circuit 32 are output directly from the output terminals OUTBa . . . OUTBk to the outside.

When performing internal logic testing and unconnected/ substandard-solder testing, the LSI 31 is tested using the testing circuit shown in FIG. 4, in the same way as in Embodiment 1.

During unconnected/substandard-solder testing, the LSI test mode signal 38 is set to a logical "1", all of the test select signals 26a . . . 26j are set to a logical "0", and the internal logic testing AND circuits 34a . . . 34j are masked. The process of unconnected/substandard-solder testing is hereafter performed in the same way as in Embodiment 1 described above.

During internal logic testing operations, the LSI test mode signal 38 is set to a logical "0", and the unconnected/ substandard-solder testing AND circuits 35 and 36 are masked. Further, for the test select signals 26a . . . 26j which are input into the internal logic testing AND circuits 34a . . . 34j, the decoder 61 outputs one signal in accordance with the test pattern from the LSI tester 52. Thus, one of the test signals Aa . . . Aj obtained by means of the operation of the internal logic circuit 32 is output from the output terminal OUTA to the LSI tester 52 of FIG. 4.

The comparator 54 in the LSI tester 52 compares the output from the LSI 31 with the expected output values from the test pattern. Then, if the output from the LSI and the expected output values are the same, then the LSI is normal. If they are not the same then there are judged to be abnormalities of some kind, in other words faults, in the LSI.

In the embodiments described above, an internal logic circuit 32 and one internal logic and unconnected/ substandard-solder testing circuit 33 are provided. However, if the scale of the LSI increases, then the internal logic circuit can be constructed from a plurality of internal logic circuits. The present invention can also be applied to LSI's equipped in this way with a plurality of internal logic circuits. In this case it is possible to provide one internal logic and unconnected/-substandard-solder testing circuit with respect to the plurality of internal logic circuits. It is also possible to provide a plurality of these. An example will now be described using FIG. 6, as a third embodiment of the present invention, in which a plurality of internal logic circuits is provided, and one internal logic and unconnected/ substandard-solder testing circuit is provided per internal logic circuit.

Figure 6:
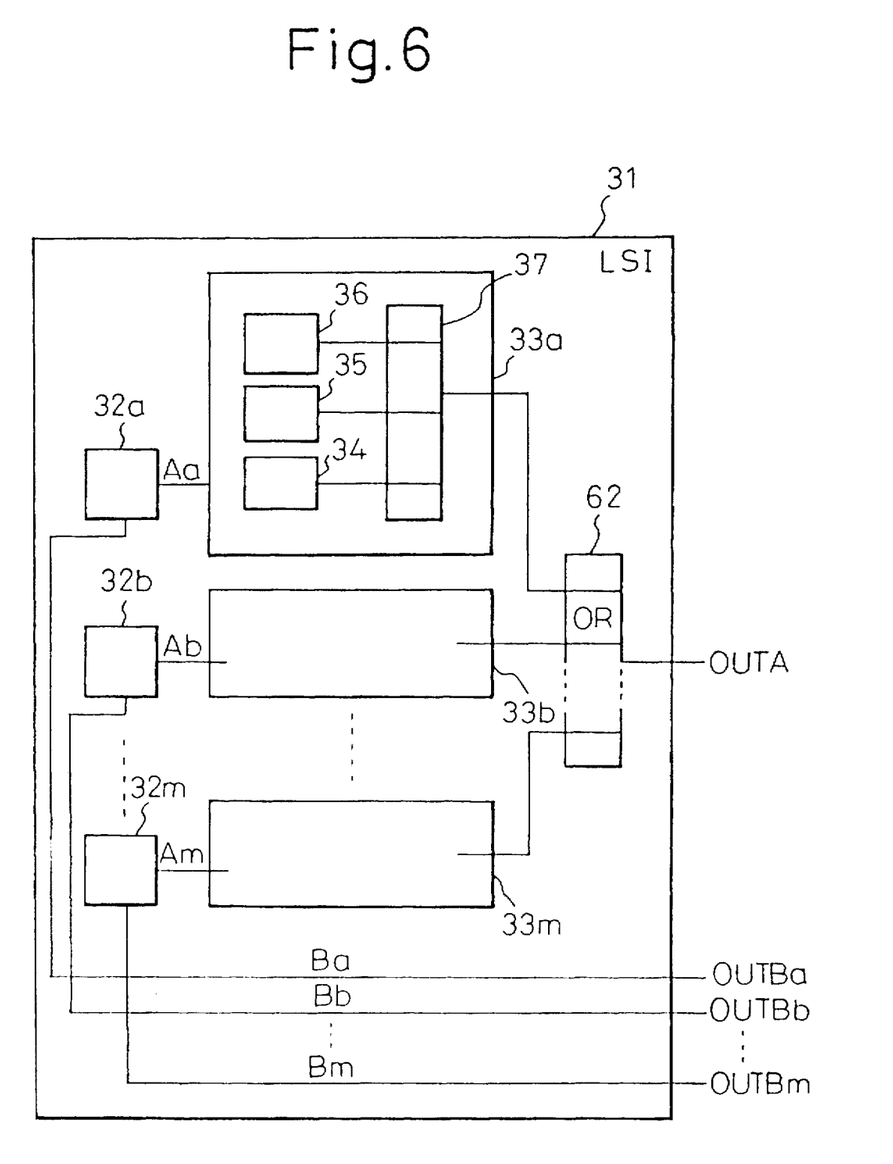
FIG. 6 is a block diagram of a third embodiment of an LSI equipped with the internal logic and unconnected/substandard-solder testing circuit of the present invention.

In FIG. 6, a plurality of internal logic circuits 32a . . . 32m is provided in the LSI 31. The normal external output signals Ba . . . Bm of the internal logic circuits 32a . . . 32m are connected directly to the external output terminals OUTBa . . . OUTBm of the LSI 31. It should be noted that the diagram shows one normal external output signal output from one internal logic circuit, but normally more than one normal external output signal is output from each internal logic circuit, and these are each connected to separate output terminals.

Internal logic and unconnected/substandard-solder testing circuits 33a . . . 33m are provided for each internal logic circuit. The outputs of the internal logic and unconnected/ substandard-solder testing circuits 33a . . . 33m are input into a single output OR circuit 62, and its output is output from a single output terminal OUTA. The relationship of the connections between the internal logic circuits and the internal logic and unconnected/substandard-solder testing circuits is the same as that shown in FIG. 5 described above, so the explanation will be omitted.

In the present embodiment, design and production have been simplified because the internal logic circuits and the internal logic and unconnected/substandard-solder testing circuits can be dealt with as a single unit.

It should be noted that, in the embodiments described above, AND circuits are employed in the internal logic testing logic circuits and the unconnected/substandard-solder testing logic circuits, and OR circuits are employed in the output logic circuits. These logic circuits may be changed for other circuits. One example of this is shown in FIG. 7.

Figure 7:
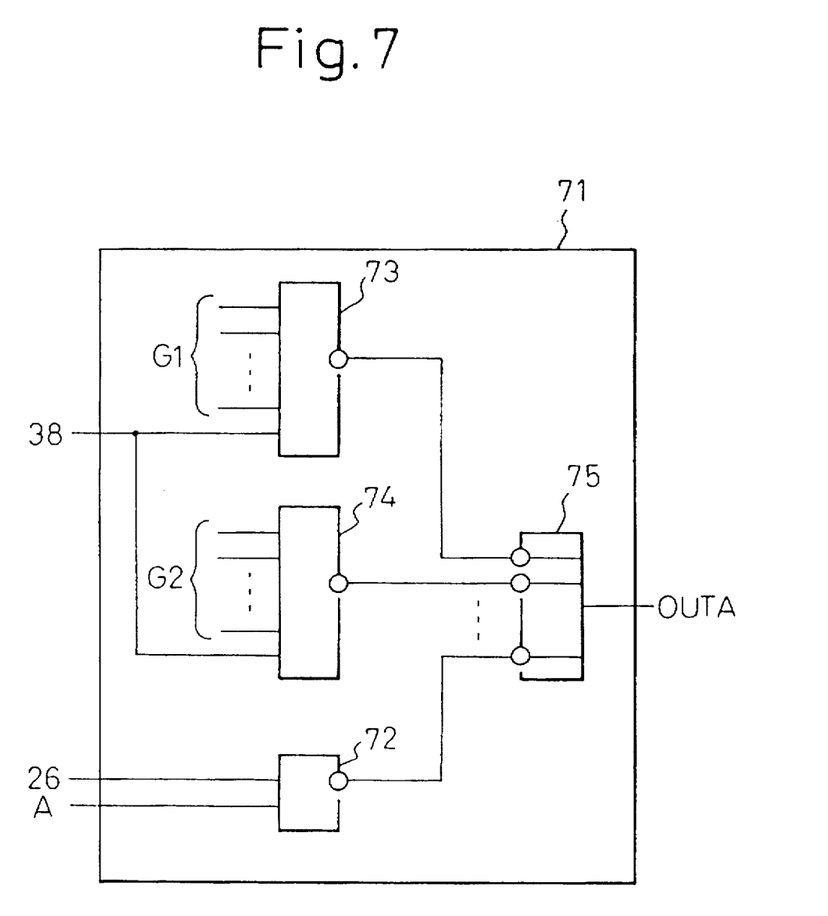
FIG. 7 is a block diagram showing an alternative example of an internal logic and unconnected/substandard-solder testing circuit.

The internal logic and unconnected/substandard-solder testing circuit 71 shown in FIG. 7 corresponds to the internal logic and unconnected/substandard-solder testing circuit 33 shown in FIG. 3. In FIG. 7, the internal logic testing logic circuit 72 and the unconnected/substandard-solder testing circuits 73 and 74 consist of NAND circuits, and the output logic circuit 75 consists of a NAND circuit. The operation of this internal logic and unconnected/substandard-solder testing circuit 71 is the same as that in FIG. 3 described above, and so the explanation will be omitted here.

I claim:

1. A large scale integrated circuit (LSI) comprising:

an internal logic circuit which outputs a normal external output signal during normal operation of the LSI, and a test signal which is used for internal logic testing;

a first output terminal to which the normal external output signal is directly connected;

at least one internal logic testing circuit connected to the internal logic circuit to receive the test signal, said internal logic testing circuit passing the test signal under the control of a test select signal which is activated during the internal logic testing;

at least one solder testing logic circuit connected to input terminals of the LSI, said solder testing logic circuit passing signals obtained through input terminals of the LSI under the control of a test mode signal which is activated during solder testing;

an output logic circuit which controls the output of the internal testing logic circuit and the output of the solder testing logic circuits; and a second output terminal connected to the output of the output logic circuit.

2. The LSI of claim 1, wherein the internal logic testing circuit and solder testing logic circuit include an AND circuit, and the output logic circuit includes an OR circuit.

3. The LSI of claim 1, wherein the internal logic testing circuit and solder testing logic circuit each include a NAND circuit, and the output logic circuit includes a NAND circuit.

4. The LSI of claim 1, wherein the LSI includes a plurality of internal logic circuits.

5. The LSI of cliam 4, wherein the LSI includes a plurality of the internal logic and solder testing circuits provided for each of the plurality of internal logic circuits, and wherein the LSI is equipped with one output logic circuit which controls each of the outputs of the plurality of internal logic and solder testing circuits.

* * * * *

UNITED STATES PATENT AND TRADEMARK OFFICE
CERTIFICATE OF CORRECTION

PATENT NO. : 5,754,561
DATED : May 19, 1998
INVENTOR(S) : Kazuhiro MASUI

It is certified that error appears in the above-identified patent and that said Letters Patent is hereby corrected as shown below:

Title page, Abstract, lines 15-16, change "abovementioned" to --above-mentioned--.

Col. 2, line 63, delete "," and after "output" (second occurrence) insert --,--.

Col. 3, line 24, change "comprises" to --comprise--.

Col. 4, lines 11, 15, 16, 18 and 19, change "abovementioned" to --above-mentioned--.

Col. 10, line 14, change "circuits" to --circuit--.

Signed and Sealed this

Eighth Day of September, 1998

Attest:

BRUCE LEHMAN

Attesting Officer        Commissioner of Patents and Trademarks